United States Patent [19]
Ohsawa

[11] Patent Number: 6,078,097
[45] Date of Patent: *Jun. 20, 2000

[54] LEAD FRAME

[75] Inventor: Kenji Ohsawa, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/787,659

[22] Filed: Jan. 21, 1997

Related U.S. Application Data

[63] Continuation of application No. 08/561,245, Nov. 21, 1995, abandoned.

[30] Foreign Application Priority Data

Nov. 22, 1994 [JP] Japan ................................ 6-314166

[51] Int. Cl.[7] ........................ H01L 23/495; H01L 23/48
[52] U.S. Cl. ........................ 257/666; 257/673; 257/692; 257/693; 257/734; 257/737; 257/738; 257/780; 257/781; 257/705; 257/706; 257/697

[58] Field of Search ..................... 257/666, 673, 257/692, 693, 734, 737, 738, 780, 781, 705, 706, 697, 735

[56] References Cited

U.S. PATENT DOCUMENTS

| | | | |
|---|---|---|---|
| 5,409,865 | 4/1995 | Karnezos | 257/738 |
| 5,608,265 | 3/1997 | Kitano et al. | 257/774 |

*Primary Examiner*—Carl Whitehead, Jr.
*Assistant Examiner*—Matthew E. Warren
*Attorney, Agent, or Firm*—Hill & Simpson

[57] ABSTRACT

In a lead frame, leads are formed on a surface of protective insulation film having a device hole. Protruding electrodes (solder balls) are formed on the surface of the leads opposite the surface closer to the protective insulation film. A reinforcement plate is also formed on the rear surface of the protective insulation film.

8 Claims, 8 Drawing Sheets

LEAD FRAME

This is a continuation, of application Ser. No. 08/561.245, filed Nov. 21, 1995 now abandoned.

BACKGROUND OF THE INVENTION

1. Field of the Invention

The present invention relates to lead frames and the manufacturing method thereof, and more particularly, to a lead frame in which the inner leads of the leads connect to electrodes of a semiconductor chip and the outer leads of the leads connect to electrodes of a printed circuit board or the like through protruding electrodes and the manufacturing method thereof.

2. Description of the Related Art

An example of a connection between a semiconductor chip and a printed circuit board or the like through an organic substrate having protruding electrodes such as solder balls is disclosed in U.S. Pat. No. 5,136,366. The structure of this conventional example will be described below by referring to its cross section shown in FIG. 1.

In FIG. 1, a semiconductor chip "b" is mounted on a surface of a multilayer organic wiring substrate "a" having about two to six layers and using an organic material. Wiring film "c" formed on the surface of the substrate "a" is connected to electrodes of the semiconductor chip "b" through connection wires "d" made of gold or the like.

Solder balls "e" formed on the opposite surface of the substrate "a" are electrically connected to the wiring film "c" via through holes. There is also shown solder resist film "f," sealing resin "g," and a printed circuit board "h."

In the conventional example shown in FIG. 1, the multilayer organic wiring substrate "a" with which the semiconductor chip "b" is mounted and resin-sealed on the main surface and the solder balls "e" serving as protruding electrodes are formed on the other surface is connected to the printed circuit board "h" with the solder balls "e."

Since electrodes of the semiconductor chip "b" are connected to the wiring film "c" on the multilayer organic wiring substrate "a" called BGA through the connection wires "d," made of gold or the like, parasitic resistance inevitably becomes large. In addition, a wire-bonding process is required, which requires time which cannot be ignored, thus being a factor for increasing cost.

Since the semiconductor chip "b" is mounted and resin-sealed on the main surface of the substrate "a," it is difficult to respond to an increasing demand for making semiconductor devices thinner.

There are also other drawbacks related to the multilayer organic wiring substrate "a." These are a very high manufacturing cost due to the complicated manufacturing process, a high defect rate which cannot be ignored due to its tendency to generate warps, and a probability of water invasion from the side faces of the substrate.

SUMMARY OF THE INVENTION

Accordingly, it is an object of the present invention to provide a highly reliable lead frame and the manufacturing method thereof which respond to a demand for making semiconductor devices thinner and more inexpensive.

The foregoing object is achieved according to one aspect of this invention through the provision of a lead frame wherein a number of leads having their inner leads extending over a device hole are connected to electrodes of a semiconductor chip and their outer leads are connected to protruding electrodes are formed on a surface of protective insulation film having the device hole, the outer leads being provided with the protruding electrodes on the surface opposite the surface which is closer to the protective insulation film.

In the lead frame, a reinforcement plate may be formed on the surface opposite the surface of the protective insulation film on which the leads are formed.

The foregoing object is achieved according to another aspect of the present invention through the provision of a manufacturing method of the lead frame, comprising the processes of: forming a number of leads on an etching stopper layer above a surface of a lead-forming substrate; adhering the protective insulation film having the device hole on the surface of the leads opposite the surface closer to the lead-forming substrate; eliminating areas of the lead-forming substrate used for forming the leads by etching from the rear side; and forming the protruding electrodes on the outer leads of the leads.

The foregoing object is achieved according to still another aspect of the present invention through the provision of a manufacturing method of the lead frame, comprising the processes of: forming a number of leads on an etching stopper layer above a surface of a lead-forming substrate; half-etching the rear surface of the lead-forming substrate corresponding to lead-forming areas; forming a solder resist having openings at positions where the protruding electrodes are to be formed, on the lead-forming surface of the lead-forming substrate; forming the protruding electrodes on the leads with the electrolytic plating method using the solder resist as a mask; etching the remaining areas on the rear surface of the lead-forming substrate corresponding to the lead-forming areas; and adhering the protective insulation film having the device hole on the surface of the leads opposite the surface on which the protruding electrodes are formed.

The foregoing object is also achieved according to a further aspect of this invention through the provision of a lead frame wherein a solder resist having openings for exposing outer leads is formed on one surface of a number of leads and protruding electrodes are formed at the exposed outer leads.

The foregoing object is achieved according to a still further aspect of this invention through the provision of a manufacturing method of the lead frame, comprising the processes of: forming a number of leads on an etching stopper layer above a surface of a lead-forming substrate; forming a solder resist having openings at positions where the protruding electrodes are to be formed, on the lead-forming surface of the lead-forming substrate; forming the protruding electrodes on the leads with the electrolytic plating method using the solder resist as a mask; and etching the remaining areas on the rear surface of the lead-forming substrate corresponding to the lead-forming areas.

With the above-described structure, the leads comprising the single-layer wiring film formed on the surface of the protective insulation film intervene between electrodes of the semiconductor chip and protruding electrodes, instead of using a multilayer organic wiring substrate, reducing the cost. In addition, since the leads have a single layer, water cannot invade between layers, increasing humidity-proofness and water-proofness. By placing a semiconductor chip in the device hole, which is provided for the protective insulation film, the semiconductor device can be made thinner.

Since the reinforcement plate is adhered to the rear surface of the protective insulation film, the lead frame is effectively prevented from being deformed and broken in the manufacturing process of the lead frame, and the mounting and resin-sealing processes of the semiconductor chip.

With a manufacturing method for the lead frame according to the present invention, since the leads are formed on the etching stopper layer above the lead-forming substrate, the leads can be made fine and they are prevented from being deformed in manufacturing even if they are thin because the lead-forming substrate functions as a support. Since the protective insulation film or the multilayer member comprising the protective insulation film and the reinforcement plate is formed on the leads, which are prevented from being deformed by the lead-forming substrate, the leads 3 are prevented from being deformed in forming processes such as that for the protective insulation film.

With a manufacturing method according to the present invention, since the etching stopper layer is made from an electrically conductive material and the protruding electrodes are formed before the process for etching the etching stopper layer, with the leads being used as masks, the etching stopper layer can be used as a path for applying the voltage required for electrolytic plating the portions where the protruding electrodes are to be formed, therefore enabling the protruding electrodes to be formed in electrolytic plating. This means that a process for placing the material for the protruding electrodes at positions where the protruding electrodes are to be formed is not necessary, making work for forming the protruding electrodes highly efficient and thus reducing the manufacturing cost.

Since the protective insulation film or the multilayer member comprising the protective insulation film and the reinforcement plate is formed on the leads after the etching stopper layer is etched, with the leads being used as masks, the protective insulation film and other components prevent the leads from being deformed in the inner-lead bonding and resin-sealing processes. In addition, since the leads have a single layer, water cannot invade between layers, increasing humidity-proofness and water-proofness, thus increasing reliability.

In a lead frame according to the present invention, instead of a multilayer, organic wiring substrate, the single-layer lead having the protective insulation film at the front surface is used and placed between the electrodes of the semiconductor chip and the protruding electrodes, reducing the cost.

With a manufacturing method according to the present invention, since the semiconductor chip is resin-sealed after inner-lead bonding, the positions of the leads and the positional relationship between the leads are fixed to the semiconductor chip with the sealing resin.

Since the etching stopper layer is made from an electrically conductive material and the etching stopper layer is etched, with the leads being used as masks, the etching stopper layer can be used as a path for applying the voltage required for electrolytic plating the portions where the protruding electrodes are to be formed, therefore enabling the protruding electrodes to be formed in electrolytic plating. This means that a process for dropping the material for the protruding electrodes at positions where the protruding electrodes are to be formed is not necessary, making work for forming the protruding electrodes highly efficient and thus reducing the manufacturing cost.

DETAILED DESCRIPTION OF THE PREFERRED EMBODIMENTS

Figure 1:
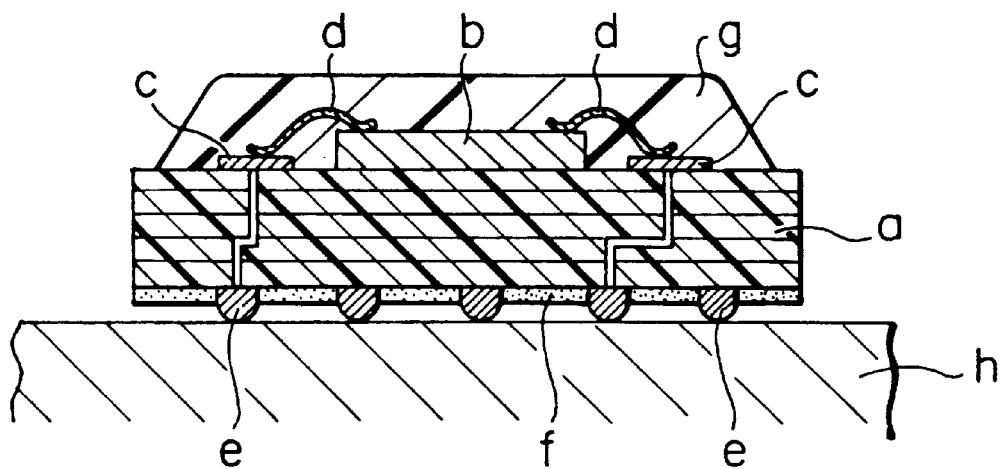
FIG. 1 is a cross section of a conventional structure.

The present invention will be described in detail according to the embodiments by referring to the drawings. Although lead frames are connected to each other, one lead frame will be mainly described for simplicity.

Figure 2:
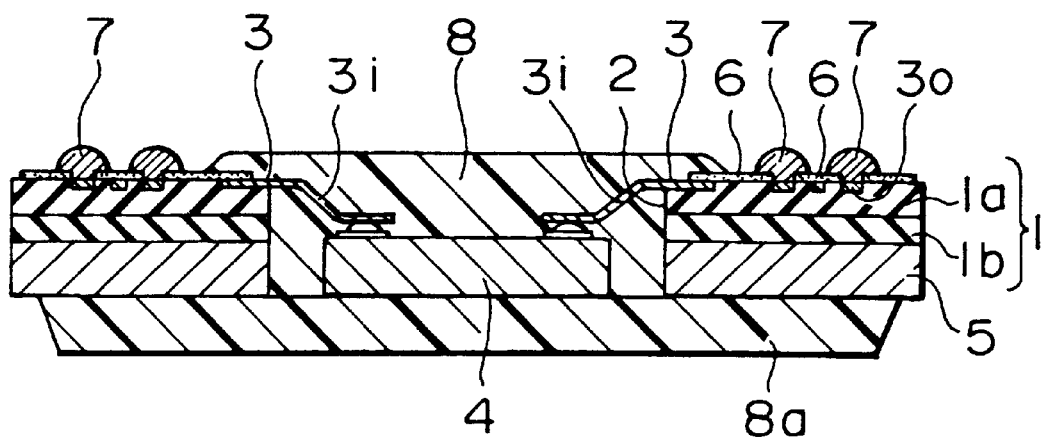
FIG. 2 is a cross section of a lead frame according to an embodiment of the present invention.

FIG. 2 is a cross section of a lead frame according to an embodiment of the present invention.

In FIG. 2, protective insulation film 1 comprises polyimide film 1a and adhesive film 1b (made of, for example, epoxy resin or polyimide having a TG of 200° C.). The polyimide film 1a may also be used as adhesive film. In that case, the protective insulation film 1 has a single layer. There is shown a device hole 2 formed in the protective insulation film 1.

Leads 3 are formed on a surface of the protective insulation film 1 in, for example, electrolytic copper plating with a pattern formed in patterning, such as a selective plating method using a photomask. Its pattern width is, for example, 20 to 100 $\mu$m, the pitch is, for example, 50 to 100 $\mu$m (the pitch limit was 100 $\mu$m for connection with a conventional gold wire between a lead and an electrode of a chip), and the thickness is, for example, 0.7 to 2 times the pattern width, that is 30 $\mu$m for example.

The inner leads "3i" of the leads 3 extend from the surface of the protective insulation film 1 over the device hole 2, and connect to electrodes of a semiconductor chip 4 at their tips. The connection is made with, for example, an ultrasonic method after the electrode is coated with aluminum, or gold/tin eutectic gang bonding after the electrode is coated with tin. The outer leads "3o" of the leads 3 are also shown.

A reinforcement plate 5 is adhered to the rear surface of the protective insulation film 1, that is, the surface opposite the surface on which the leads are formed. The plate is, for example, a metal plate such as a copper plate or a ceramic sheet. A metal plate such as a copper plate or a ceramic plate is the most appropriate reinforcement plate because it serves as a heat-radiating plate due to its high heat conductivity as well as plays a roll as a reinforcement plate due to its rigidity. For making the reinforcement plate lightweight, the plate may have a laminated structure, instead of a single-layer structure.

Solder resist 6 is selectively formed on the surface of the protective insulation film 1 on which the leads 3 are formed, it serves as an insulator between electrodes and leads as well as prevents solder bridges between adjacent leads from occurring when solder balls 7 (described next) are formed. The solder resist 6 is, for example, polyimide film or epoxy resin film about 10 to 50 $\mu$m thick. The solder resist 6 is patterned such that openings are made at the portions where the solder balls 7 are to be formed.

The solder balls 7 are formed on the outer leads "3o" as protruding electrodes. They are connected to wiring film on a printed wiring board on which the semiconductor device is mounted. The solder balls 7 may be formed with one of the following three methods. In one method, the surface of the protective insulation film 1 on which the leads 3 and the solder resist 6 are formed is coated with flux, ball-shaped solder pieces, prepared in advance, are placed on the positions where solder balls are to be formed, and then the solder is melted in reflow soldering. In another method, the exposed portions of the outer leads "3o" are solder-plated with the electrolytic plating method, using the solder resist 6 as a mask. In the other method, the exposed portions of the outer leads "3o" are electrolytic-plated with nickel or copper, then they are further plated with solder using the first plated portions as cores.

Sealing resin 8 is used for sealing the chip 4 with the transfer mold method using a metal die or with the potting method using a dispenser.

According to the embodiment shown in FIG. 2, the rear surface of the semiconductor chip 4 is not exposed at the rear surface of the resin 8, that is, the rear surface of the package. The rear surface of the semiconductor chip may be exposed to increase its capability of radiating heat by cutting a portion 8a which protrudes from the rear surface of the semiconductor chip. The rear surface of the semiconductor chip may be provided with a heat-radiating fin to increase its capability of radiating heat.

Various types of examples can be considered from this embodiment, such as the following: a protective insulation film 1 is adhered to the upper surface of a dish-shaped reinforcement plate 5 having good heat radiativity, a semiconductor chip 4 is bonded at the inner bottom surface of the reinforcement plate 5 (see FIG. 5), and then inner-lead bonding is performed for connecting between electrodes of the semiconductor chip 4 and inner leads.

According to the lead frame shown in FIG. 2, the leads 3 comprising the single-layer wiring film formed on the surface of the protective insulation film 1 intervene between electrodes of the semiconductor chip 4 and solder balls 7 serving as protruding electrodes, instead of using a multi-layer organic wiring substrate, reducing the cost. In addition, since the leads have a single layer, water cannot invade between layers, increasing humidity-proofness and water-proofness, thus increasing reliability.

By placing a semiconductor chip in the device hole 2, which is provided for the protective insulation film 1, the semiconductor device can be made thinner.

Since TAB tape is not used, a complicated process for adhering TAB tape to a wiring substrate is not required. Therefore, the yield rate does not decrease due to positioning shifts of the TAB tape.

Since in this lead frame the reinforcement plate 5 is adhered to the rear surface of the protective insulation film 1, the lead frame is prevented from being deformed and broken in the manufacturing process and the mounting and resin-sealing processes of the semiconductor chip 4.

FIGS. 3A through 3K are perspective views and typical cross sections of the lead frame shown in FIG. 2, which indicate processes (A) through (J) of a manufacturing method according to an embodiment of the present invention, in the order of the processes. The manufacturing method will be described below in the order of the processes.

Figure 3A:
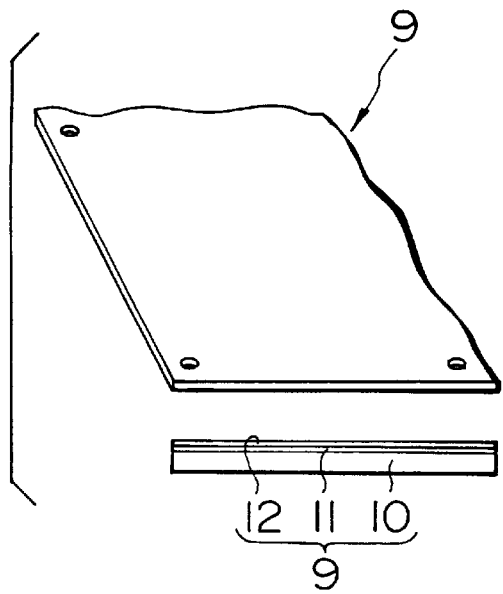
FIGS. 3A, 3B, 3C, 3D, 3E, 3F, 3G, 3H, 3I, 3J, and 3K are perspective views and typical cross sections of the lead frame shown in FIG. 2, which indicate the processes (A) through (J) of a manufacturing method according to an embodiment of the present invention.

(A) A base 9 shown in FIG. 3A is prepared first. The base 9 is a three-layer laminated plate in which an aluminum layer 11 having a thickness of, for example, about 3 $\mu$m, is formed on a surface of a thin plate 10 made of, for example, copper (hereinafter called a copper substrate) having a thickness of, for example, about 150 $\mu$m, and then thin copper film 12 having a thickness of, for example, about 2 $\mu$m is formed on the aluminum film 11. The aluminum film 11 serves as etching stopper film for preventing the front surface of the base 9 from being etched when the copper substrate 10 is etched. The thin copper film 12 serves as a ground coat for copper plating used for forming the leads 3, otherwise satisfactory plating is difficult to obtain.

The copper substrate 10 corresponds to the lead-forming substrate described in claims. The lead-forming substrate itself does not function as a lead and is not required at the final stage. The substrate is transiently required, however, as a substrate in forming very thin leads and as a frame afterwards, hence it is called as such.

Figure 3B:
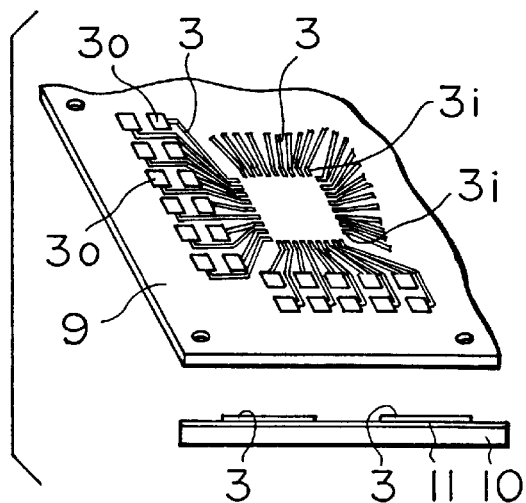

(B) The leads 3, made of copper, are formed on the surface of the base 9, that is, the surface of the thin copper film 12 with the selective plating method as shown in FIG. 3B. The selective plating method selectively coats the surface with resist film or the like and performs electrolytic plating using the resist film or the like as a mask. As described above, leads formed by selectively plating the base 9, made of metal, with copper in the electrolytic plating method has better film quality and can be used in finer patterns than leads of TAB tape.

After the leads are formed, holes for easy manufacturing and slits for preventing deformation are made by selectively etching the base 9 on both surfaces. Since these holes and slits have no direct relation with the essence of the present invention, they are neither shown nor described.

Figure 3C:
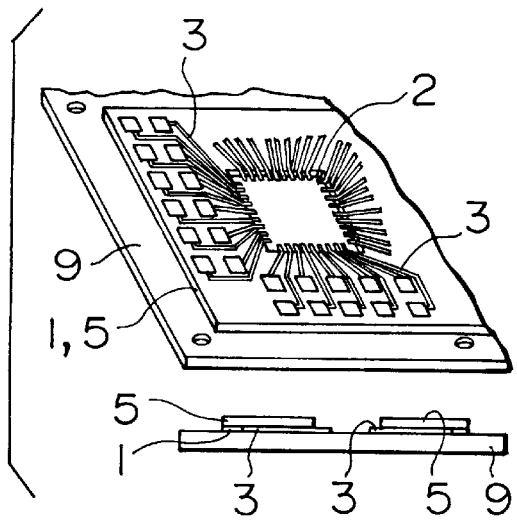

(C) As shown in FIG. 3C, a member laminated with the protective insulation film 1 and the reinforcement plate 5 is adhered to the surface of the base 9 on which the leads 3 are formed. This laminated member has the device hole 2 and is formed in rectangular shapes such that the member is large enough to completely cover the leads 3 except the portions of the leads protruding on the device hole 2. The laminated member is shown i n the perspective view of FIG. 3C as if the leads 3 were seen through the protective insulation film 1 and the reinforcement plate 5.

Figure 3D:
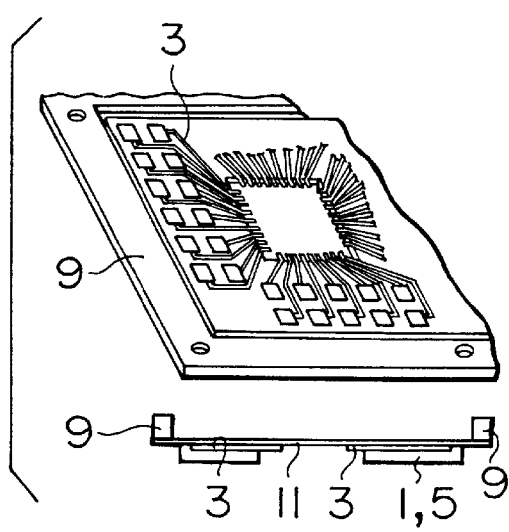

(D) The lead frame is turned upside down. The portions of the copper substrate 10 corresponding to the leads 3 are eliminated by selectively etching the substrate 10 from the rear surface, as shown in FIG. 3D. In other words, the copper substrate 10 is etched such that only the frame section of the copper substrate 10, which is suitable to be left for convenience of manufacturing, remains. This selective etching is performed by forming patterned resist film on both surfaces and by etching the copper substrate using the resist film as a mask, with an etching solution made from, for example, sulfuric acid and hydrogen peroxide. In this etching, the leads 3 are not etched because the aluminum film 11 serves as an etching stopper. For convenience, the perspective view of FIG. 3D is illustrated with the aluminum film 11 and the thin copper film 12 being ignored so that the leads 3 are seen from the rear side.

Figure 3E:
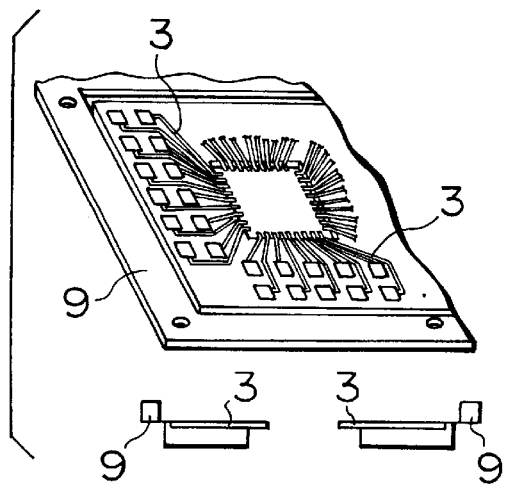

(E) As shown in FIG. 3E, the aluminum film 11 is selectively eliminated by etching it using the leads 3 as masks. Then, the thin copper film 12, which is used as a ground coat for electrolytic plating used for forming the leads 3, is eliminated by etching it by 2 μm. Each lead is made separate from the other. The leads are no longer electrically short-circuited with the aluminum film :11 and the thin film 12. When the copper film 12 is etched, the leads 3, made of copper, are also etched. Since the thickness of an etched portion is as small as 2 to 3 μm, however, and the leads 3 are, for example, 30 μm thick, this etching has almost no effect.

Figure 3F:
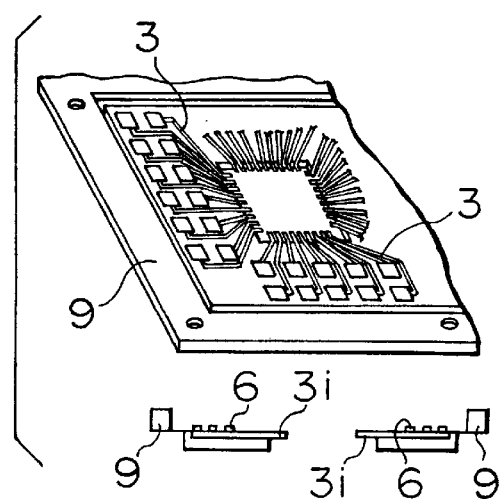

(F) The solder resist 6 is formed as shown in FIG. 3F. For convenience, the solder resist 6 is not shown in the perspective view.

Figure 3G:
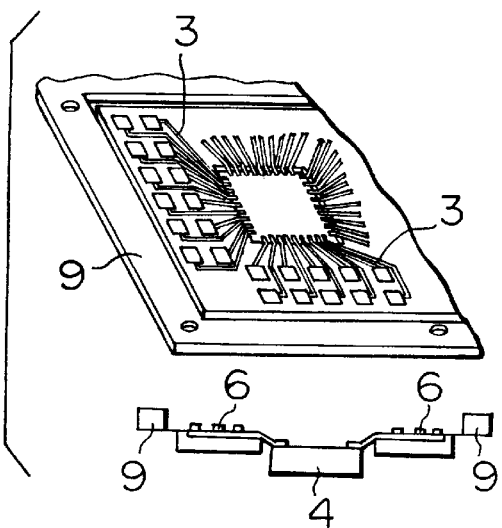

(G) Inner-lead bonding is performed as shown in FIG. 3G. The tip of each inner lead "3i", which is protruded over the device hole 2, is connected to an electrode of the semiconductor chip 4.

Figure 3H:
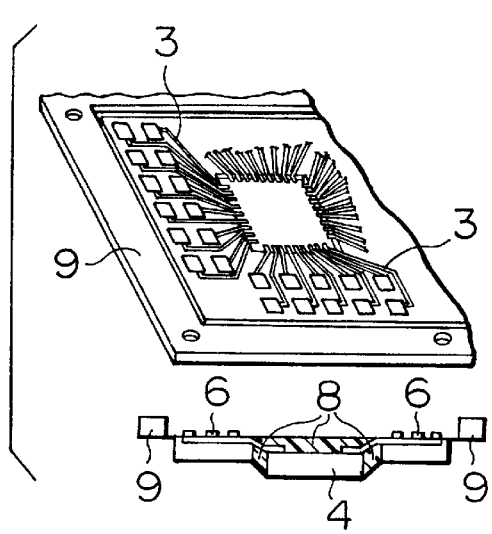

(H) The semi conductor chip 4 is sealed with resin 8 as shown in FIG. 3H.

Figure 3I:
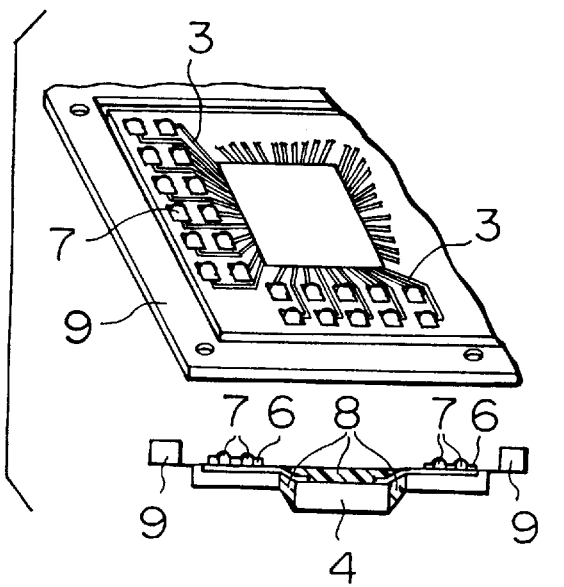

(I) The solder balls 7, which serve as protruding electrodes, are formed as shown in FIG. 3I. In order to form the solder balls 7, almost ball-shaped solder pieces, prepared in advance, are dropped to the tips of outer leads, and then they are melted in reflow soldering.

Then, whether electrically defective portions exist is checked and the electrical characteristics are measured.

Figure 3J:
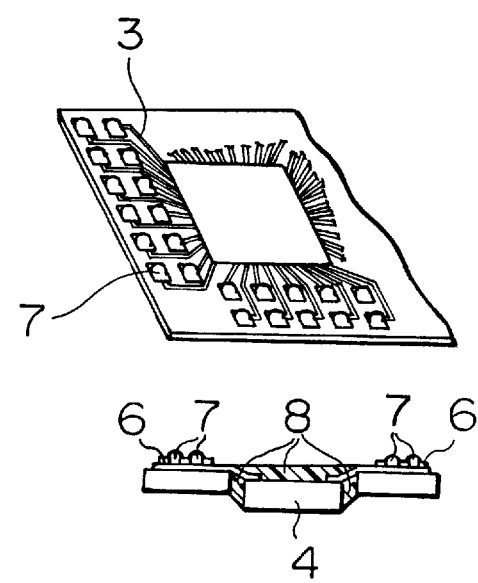
Figure 3K:
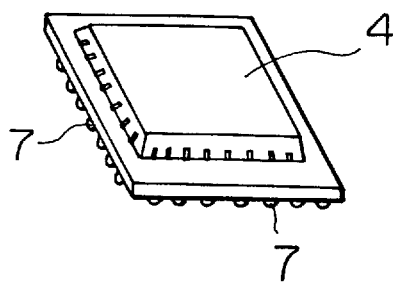

(J) Each lead frame is separated from the other as shown in FIG. 3J, completely eliminating the copper substrate 10. The lead frame is turned upside down. This is shown in FIG. 3K.

With this manufacturing method for the lead frame, since the leads 3 are formed on the aluminum film 11, which serves as an etching stopper, above the copper substrate 10 with the selective electrolytic plating method, the leads 3 can be made fine and they are prevented from being deformed in manufacturing even if they are thin because the copper substrate 10 functions as a support. Since the multilayer member comprising the protective insulation film 1 and the reinforcement plate 5 is formed on the leads 3, which are prevented from being deformed by the copper substrate 10, the leads 3 are prevented from being deformed in forming processes such as that for the protective insulation film.

The unnecessary portions of the copper substrate 10 are eliminated by etching and the unnecessary portions of the etching stopper layer 11 are eliminated by etching with the leads being used as masks. The thin copper film 12 is eliminated by minimum etching required for removing the film 12, which works as a ground coat for copper plating used for forming the leads 3. Unnecessary sections are all removed, obtaining the lead frame shown in FIG. 2 without any problems.

FIGS. 4A through 4H are perspective views and typical cross sections of the lead frame shown in FIG. 2, which indicate processes (A) through (H) of a manufacturing method according to another embodiment of the present invention, in the order of the processes. The manufacturing method will be described below in the order of the processes.

Figure 4A:
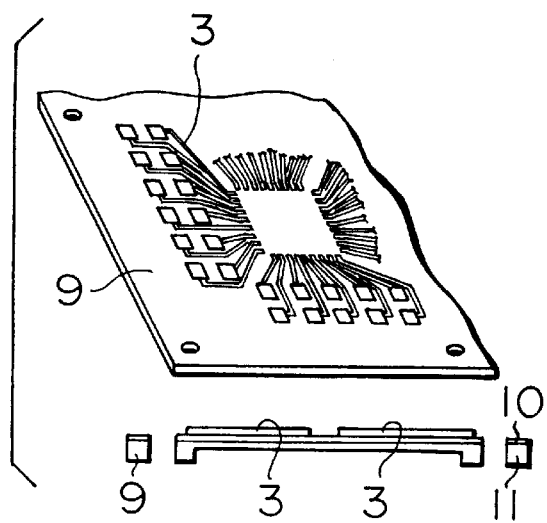
FIGS. 4A, 4B, 4C, 4D, 4E, 4F, 4G, and 4H are perspective views and typical cross sections of the lead frame shown in FIG. 2, which indicate processes (A) through (G) of a manufacturing method according to another embodiment of the present invention.

(A) A base 9 on which the leads 3, made of copper, are formed is prepared in the same way as shown in FIGS. 3A and 3B. In other words, the leads 3, made of copper, are formed on a surface of the base 9, that is, the surface of thin copper film 12, with the selective plating method. The base 9 is selectively masked with a resist film on both surfaces. By etching the base 9 on both surfaces to make its thickness one half, holes and slits necessary for manufacturing convenience or for preventing deformation are formed on the base 9. At the same time, the portions of the copper substrate 10 corresponding to the leads 3 to be formed are half etched. FIG. 4A shows the lead frame in this condition (the lead frame for which this etching has been finished).

Figure 4B:
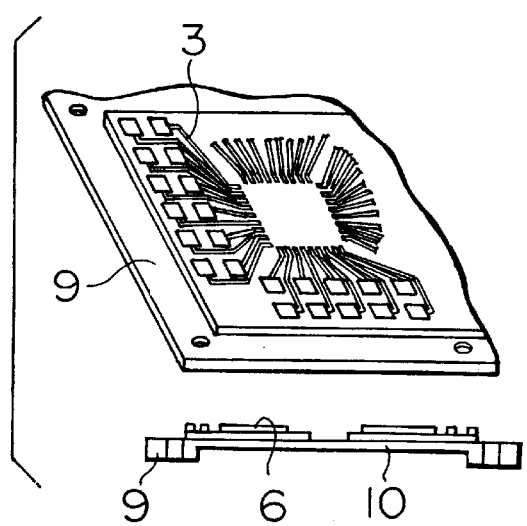

(B) The solder resist 6 is selectively formed on the surface of the base 9 on which the leads 3 are formed, as shown in FIG. 4B.

Figure 4C:
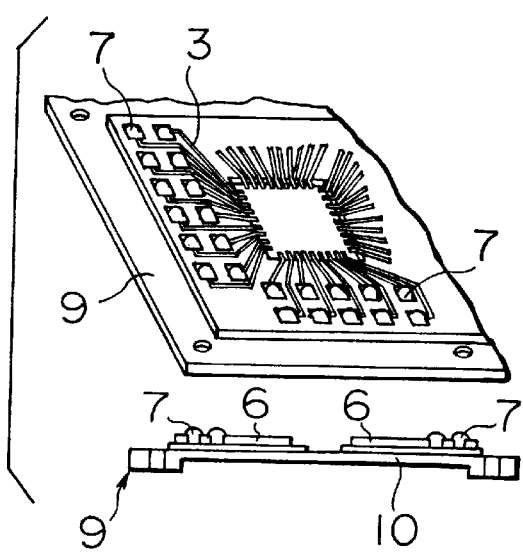

(C) The solder balls 7 are formed at the tips (where the solder resist 6 does not cover) of the outer leads "3o" of the leads 3, as shown in FIG. 4C.

These solder balls 7 can be formed with the electrolytic plating method, increasing work efficiency. This is because the base 9 (a three-layer laminated plate comprising a copper substrate 10 serving as a lead forming substrate, aluminum film 11 serving as an etching stopper layer, and thin copper film 12 serving as a ground coat for plating used for forming leads) is made from an electrically conductive material, giving a potential required for electrolytic plating to each portion where a solder ball is formed via the base 9 itself without any wiring. Solder balls can be formed in electrolytic plating even if a special electrolytic plating circuit is not made. Troublesome work for placing ball-shaped solder pieces at positions where solder balls are to be formed is eliminated.

Figure 4D:
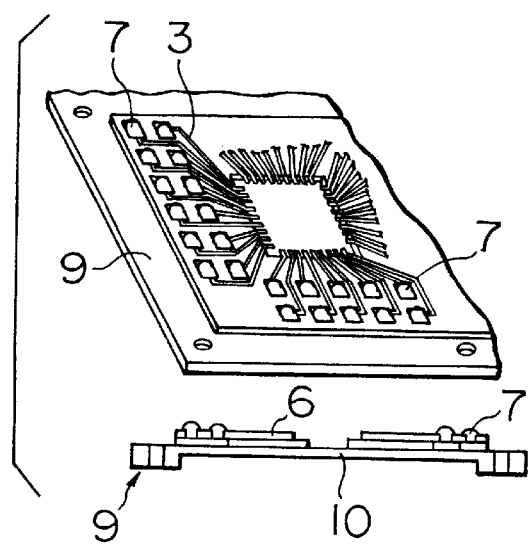

(D) The copper substrate 10 of the base 9 is etched, with the front surface of the lead frame being entirely masked with a resist film and the rear surface being selectively masked with a resist film to eliminate unnecessary portions (mainly portions other than those half etched) of the copper substrate 10. FIG. 4D shows the lead frame for which this etching has been performed.

Figure 4E:
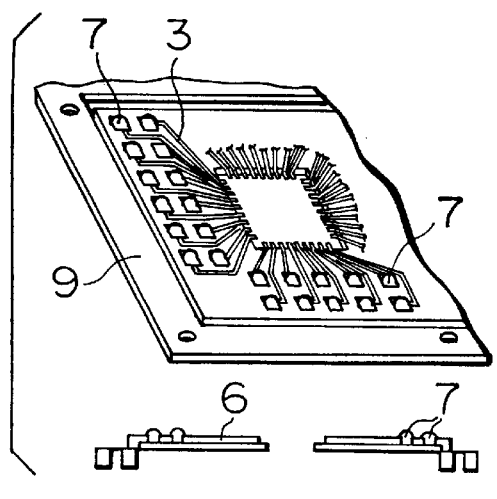
Figure 4F:
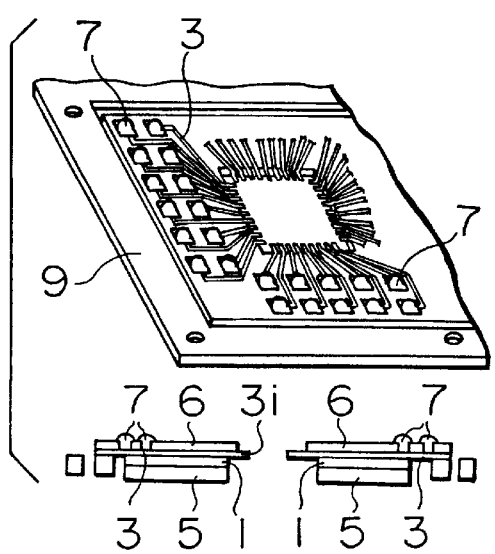
Figure 4G:
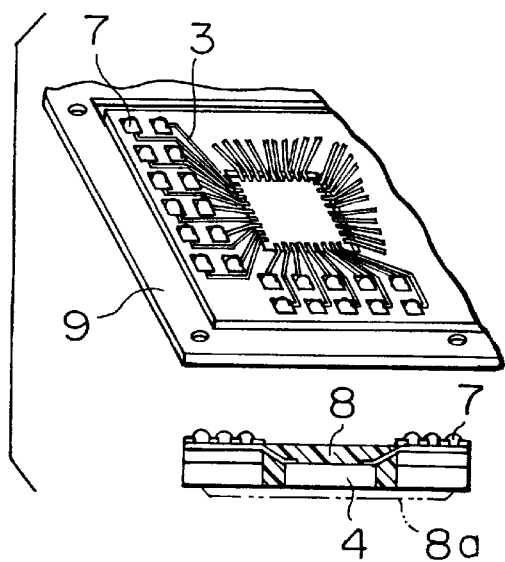

(E) The aluminum film 11 is etched, with the leads 3 being used as masks. The thin copper film 12 is eliminated by copper etching. Each lead becomes electrically separated. FIG. 4E illustrates the lead frame for which these two types of etching have been performed.

(F) On the surface opposite the surface on which solder balls 7 are formed, a member laminated with protective insulation film 1 and a reinforcement plate 5 is adhered.

Figure 4H:
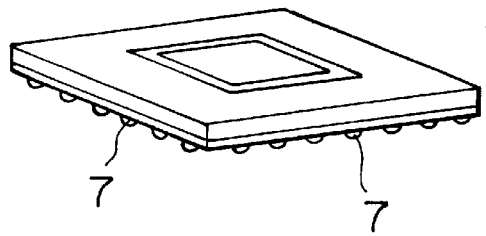

(G) Inner-lead bonding is performed, then the chip is resin-sealed. Fig. G shows the lead frame for which resin sealing has been performed. The lead frame is turned upside down (the surface on which the solder balls 7 are formed is placed downward). FIG. 4H shows the lead frame in that condition.

The process for adhering the member laminated with the protective insulation film 1 and the reinforcement plate 5 on the surface may be performed after the inner-lead bonding process.

With the manufacturing method described above of the lead frame, since the solder balls 7 serving as protruding electrodes are formed before the process for etching the etching stopper layer 11, made of aluminum, with the leads 3 being used as masks, the etching stopper layer 11 can be used as a path for applying the voltage required for electrolytic plating, therefore enabling the solder balls 7 to be formed in electrolytic plating. This means that a process for preparing a number of ball-shaped solder pieces and placing them at positions where solder balls are to be formed is not necessary, making work for forming solder balls (protruding electrodes) highly efficient and thus reducing the manufacturing cost.

Since the multilayer member comprising the protective insulation film 1 and the reinforcement plate 5 is formed on the leads 3 after the etching stopper layer 11, made of aluminum, is etched, with the leads 3 being used as masks, the protective insulation film 1 and other components prevent the leads 3 from being deformed in the inner-lead bonding and resin-sealing processes. The lead frame shown in FIG. 2 is thus obtained without any problems.

Figure 5:
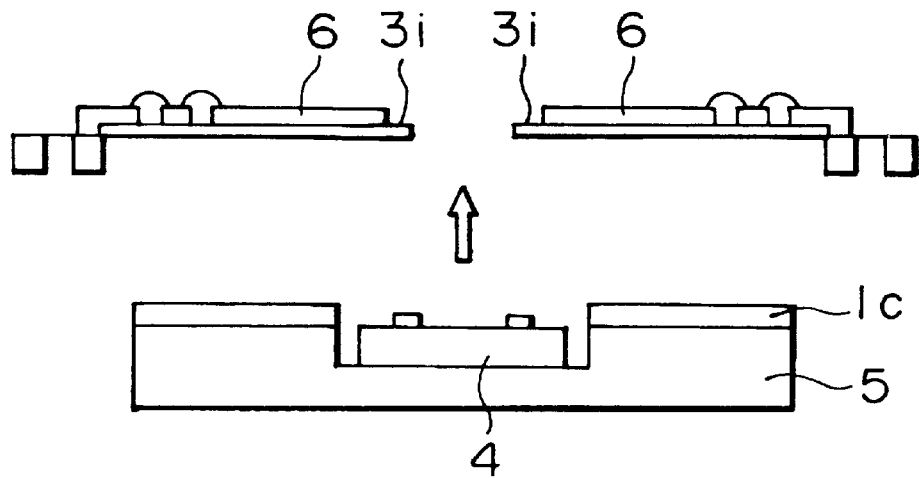
FIG. 5 is a cross section of the lead frame shown in FIG. 2, which illustrates another example of the manufacturing method shown in FIGS. 4A through 4H.

FIG. 5 is a cross section of a lead frame, which indicates another example of the lead-frame manufacturing method shown in FIG. 4.

In this example, after the process shown in FIG. 4E, the semiconductor chip 4 is chip-bonded to the inner bottom surface of a dish-shaped, heat-radiating plate 5 (for example, made of copper) on which the insulation film 1c is adhered and the electrodes of the semiconductor chip 4 are connected to the inner leads "3i" of the leads 3, as shown in FIG. 5. With this method, capacity to radiate heat is made quite successful. The other part of this manufacturing method is the same as that shown in FIG. 4A to 4H.

Figure 6A:
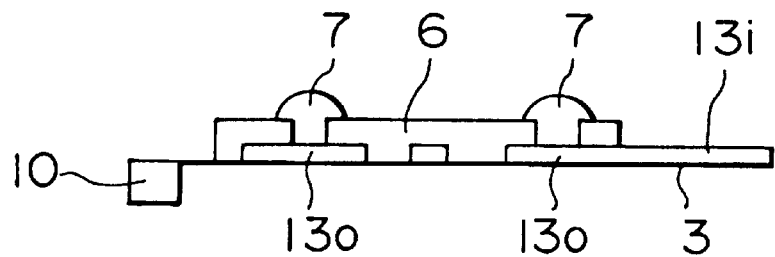
FIGS. 6A and 6B are cross sections of a lead frame according to another embodiment of the present invention.
Figure 6B:
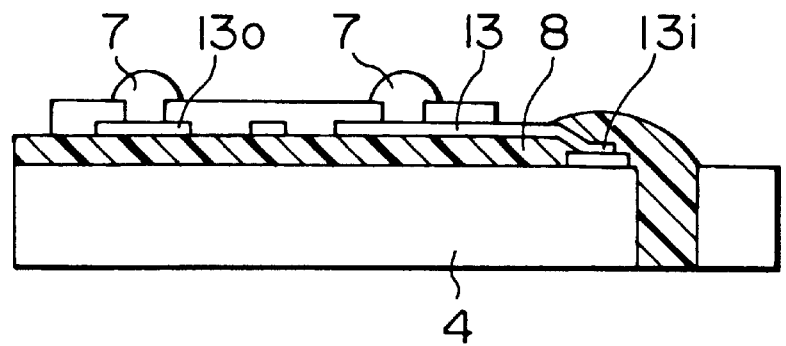

FIGS. 6A and 6B show typical cross sections of a lead frame according to another embodiment of the present invention. FIG. 6A illustrates the lead frame before inner-lead bonding, and FIG. 6B illustrates the lead frame after sealing.

Solder resist 6 is formed on leads 13. Solder balls 7 serving as protruding electrodes are formed on outer leads "13o" at the openings of the solder resist 6.

A portion 10 is the portion of the lead-forming substrate left after etching. It can be called the frame of a lead frame. It is cut after the inner-lead bonding and resin sealing processes.

Electrodes of a semiconductor chip 4 are connected to inner leads "13i." The chip 4 is sealed with sealing resin 8.

Since the lead frame is placed above the semiconductor chip 4 with the sealing resin 8 placed therebetween, the solder balls 7 are positioned above the semiconductor chip 4. This configuration contributes to making a semiconductor device compact. Instead of a multilayer, organic wiring substrate, the single-layer lead 13 having the protective insulation film at the front surface is used and placed between the electrodes of the semiconductor chip 4 and the solder balls 7, reducing the cost.

Since TAB tape is not used, a complicated process for adhering TAB tape onto a wiring substrate is not required. Therefore, the yield rate does not decrease due to positional shifts of TAB tape.

FIGS. 7A through 7E are cross sections of the lead frame shown in FIG. 6, which indicate the processes of a manufacturing method.

Figure 7A:
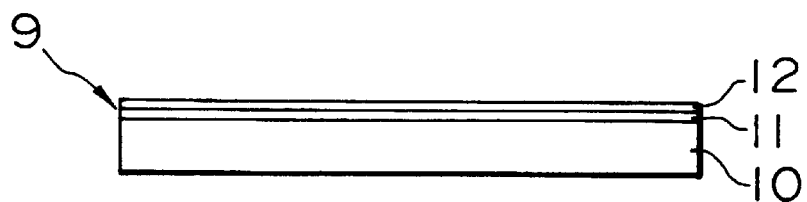
FIGS. 7A, 7B, 7C, 7D, and 7E are typical cross sections of the lead frame shown in FIG. 6, which indicate the processes of a manufacturing method according to an embodiment of the present invention.

(A) A three-layer base 9 comprising thin copper film 12, which will work as leads, an etching stopper layer 11 made of aluminum, and a copper substrate 10 in that order is formed as shown in FIG. 7A.

Figure 7B:
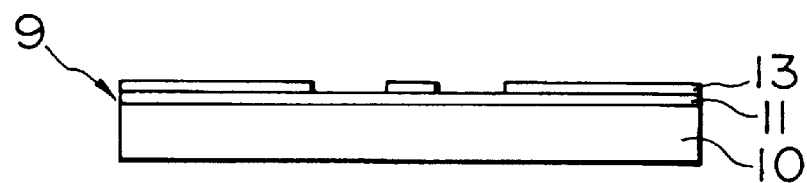

(B) The leads 13 are formed with a pattern by selectively etching the thin copper film 12, as shown in FIG. 7B.

Figure 7C:
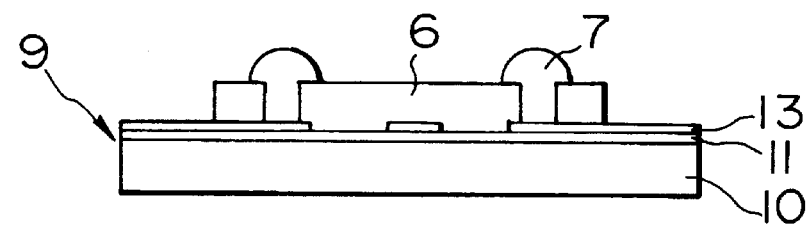
Figure 7D:
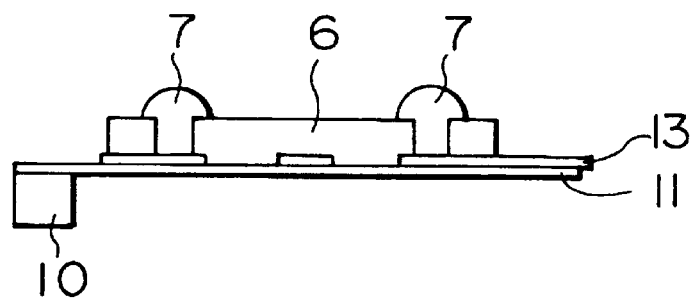

(C) Solder resist 6 is selectively formed on the surface of the base 9 on which the leads 13 have been formed. Then, solder balls 7 are formed with, for example, the electrolytic plating method. FIG. 7C shows the lead frame on which the solder balls 7 are formed.

It is needless to say that forming the solder balls 7 with the electrolytic method increases the efficiency of this forming work.

(D) The copper substrate 10 is etched, with the front surface of the base 9 being entirely masked and the rear surface being selectively masked. The portions on the rear surface corresponding to the positions where leads are formed are eliminated and only the frame of the lead frame is left.

Figure 7E:
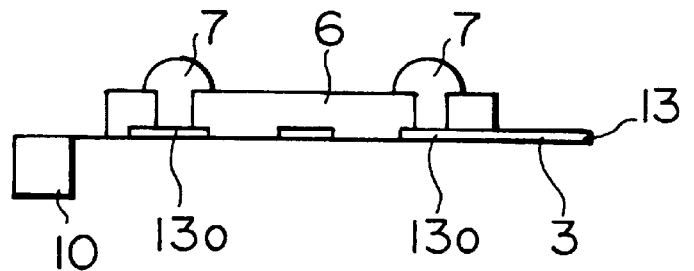

(E) The etching stopper layer 11 is eliminated by etching as shown in FIG. 7E. Each lead 13 becomes separated from the other. The semiconductor chip 4 becomes ready to be inner-lead bonded.

Inner-lead bonding, resin sealing (for example, with the bonding method or the transfer mold method), and cutting the remaining portions of the substrate 10 are performed. Assembling is finished.

With the manufacturing method of the lead frame, the positions of the leads and the positional relationship between the leads are fixed with resin 8 used for sealing the semiconductor chip 4. The semiconductor chip 4 also functions as a reinforcement plate for the leads 13.

The leads 13 may be formed with the selective electrolytic plating method using the thin copper film as a ground coat in the same way as in the manufacturing methods shown in FIGS. 3 and 4.

In the above-described embodiments, the leads of the lead frame may have a multilayer wiring structure having, for example, two layers, instead of a single wiring structure.

What is claimed is:

1. A semiconductor device comprising a plurality of leads embedded in an insulating film such that a plane surface is comprised of first surfaces of said leads and a first surface of said insulating film, said first surface of said insulating film being opposite a second surface on which protruding electrodes are formed, and a protective insulation film, having a device hole on said plane surface, inner portions of said leads extended to said device hole to connect corresponding electrodes of a semiconductor chip, said protruding electrodes connected to outer portions of said leads.

2. A lead frame according to claim 1, wherein a reinforcement plate is formed on the surface opposite the surface of said protective insulation film on which said leads are formed.

3. A semiconductor device comprising:
   a plurality of leads having inner lead portions and outer lead portions;
   a portion of said leads embedded in an insulating film such that a first surface of the insulating film is substantially co-planar with a surface of a portion of the leads, protruding electrodes formed at the exposed outer lead portions extending over a second surface of the insulating film which is opposite the first surface;
   a surface of a protective insulation film formed adjacent the first surface; and
   wherein the inner lead portions connect with respective electrodes of a semiconductor device.

4. A semiconductor device comprising:

a plurality of leads embedded in an insulating film such that a first surface of said leads is substantially in a same plane as a first surface of said insulating film and wherein a portion of said leads extends from said insulating film and is connected to corresponding electrodes of a semiconductor chip;

said insulating film having openings therein corresponding to each of said leads to expose said leads and protruding electrodes formed in each of said openings.

5. The semiconductor device of claim 4, wherein said insulating film is comprised of a photosensitive material.

6. The semiconductor device of claim 5, comprising semiconductor chip having a plurality of electrodes, each of which are connected to a corresponding inner lead portion.

7. A semiconductor device according to claim 4, wherein the semiconductor chip is adhered to said same plane with with an adhering layer.

8. A semiconductor device according to claim 7, wherein said adhering layer is comprised of an elastic material.

* * * * *